United States Patent [19]
Roach

[11] Patent Number: 5,121,075
[45] Date of Patent: Jun. 9, 1992

[54] PRECISION PROGRAMMABLE ATTENUATOR

[75] Inventor: Steven D. Roach, Colorado Springs, Colo.

[73] Assignee: Hewlett-Packard Co., Palo Alto, Calif.

[21] Appl. No.: 664,265

[22] Filed: Mar. 4, 1991

[51] Int. Cl.$^5$ .............................................. H03F 3/68
[52] U.S. Cl. .................................. 330/126; 330/282; 330/284; 330/295; 333/81 R
[58] Field of Search ............... 330/125, 126, 144, 145, 330/284, 282, 86, 295; 307/540; 324/123 R, 123 C; 333/81 R

[56] References Cited
U.S. PATENT DOCUMENTS 2,778,883  1/1957  Buckerfield ........................ 330/126
4,523,161  6/1985  Miles .................................. 307/568

FOREIGN PATENT DOCUMENTS

207609  8/1990  Japan .................. 333/81 R

Primary Examiner—James B. Mullins

[57] ABSTRACT

The precision programmable attenuator of the present invention makes use of a pair of non-interactive parallel connected divider circuits to provide a flat frequency response over a wide bandwidth. A first of these divider circuits is a low frequency divider circuit which provides a predetermined attenuation of low frequency signals. The second high frequency divider attenuates the high frequency signals and does not interact with the low frequency attenuator. Therefore, each of these dividers can be separately tuned independent of the other. The implementation of the low frequency divider is a resistive divider network which provides a DC coupling of the input signal to the output. The high frequency divider is comprised of an adjustable capacitor divider network which is automatically electronically tuned to obtain the desired high frequency gain response.

39 Claims, 5 Drawing Sheets

PRECISION PROGRAMMABLE ATTENUATOR

FIELD OF THE INVENTION

This invention relates to attenuators and, in particular, to an attenuator that is programmable to provide a precise level of signal attenuation uniformly over a wide bandwidth.

PROBLEM

It is a problem in the field of attenuators to produce a flat frequency response over a wide bandwidth without requiring complex tuning procedures. Attenuators are used in many applications, such as oscilloscopes, to reduce the amplitude of an input signal by a predetermined factor. The resultant signal is then applied to the input of a precision amplifier which produces the drive signals necessary for the oscilloscope. The attenuator must also provide a very high input impedance to prevent the attenuator from affecting the signal source.

Prior art attenuator circuits typically make use of tuned RC circuits in order to provide the signal attenuation function. These tuned RC circuits provide a low pass capability, with a flat magnitude response from DC to a predetermined high frequency. Outside of this range of frequencies, the attenuation of the tuned RC filter significantly increases. It is not uncommon to connect two or more tuned RC circuits in series to obtain combinations of attenuation. If these series connected stages are switchably connectable in different combinations, then each of these tuned RC circuit stages must be adjusted to present uniform input and output impedances. Complex tuning procedures are required, since the plurality of tuned RC circuits are typically interactive in their operation. The interactiveness of this circuitry and the difficulty in precisely tuning the various stages causes a significant problem when the attenuator elements change impedance characteristics due to temperature variations or aging of components. The ability of a user to maintain the precision tuning of this attenuator is extremely difficult and costly. In very high performance attenuators, the RC attenuators are typically adjusted in the factory using complex test equipment and complex procedures to obtain the required precision.

One alternative to the use of tuned RC circuits to divide a signal into high frequency and low frequency components is illustrated in the wide band amplifier of U.S. Pat. No. 3,573,644. This wide band amplifier is constructed to have two signal paths, one designed for optimum high-frequency performance and the other designed for optimum low-frequency and DC performance. The signals in the two paths are combined in a differential amplifier and the output fed back to the DC signal path in such a manner that any DC signal drift in the AC signal path is reduced. However, this wide band amplifier is an active device and cannot withstand the high voltage typically applied to attenuators.

SOLUTION

The above described problems are solved and a technical advance achieved in the field by the precision programmable attenuator of the present invention which makes use of a pair of non-interactive parallel connected divider circuits to provide a flat frequency response for an attenuator. A first of these divider circuits is a low frequency divider circuit which provides a predetermined attenuation of low frequency signals. The high frequency divider attenuates the high frequency signals and does not interact with the low frequency attenuator. Therefore, each of these dividers can be separately tuned independent of the other. In addition, passive components are used to provide the attenuation factor and can therefore withstand the high voltage signals typically applied to attenuators, in contrast to the active components found in amplifier circuits.

The implementation of the low frequency divider is a resistive divider network which provides a DC coupling of the input signal to the output. The high frequency divider is comprised of an adjustable capacitor divider network which is automatically tuned to obtain the desired high frequency gain. A feedback path is included from the output of this circuit to the low frequency divider in order to extend the frequency response of the overall circuit to DC A summing circuit combines the outputs of the low frequency and high frequency dividers and applies the combined signal to a driver amplifier which transmits the composite signal to the output of the attenuator. The use of a purely resistive low frequency divider and a purely capacitive high frequency divider eliminates the interaction found in prior art attenuator circuits and enables the automatic tuning of the attenuator under software control. In particular, the capacitive voltage divider includes at least one variable capacitor which can be comprised of a mechanically variable capacitor which operates via a servo motor under electronic control. Thus, the circuit tuning can be accomplished electronically even though the variable capacitor is implemented using a mechanically variable element.

DETAILED DESCRIPTION

Figure 10:
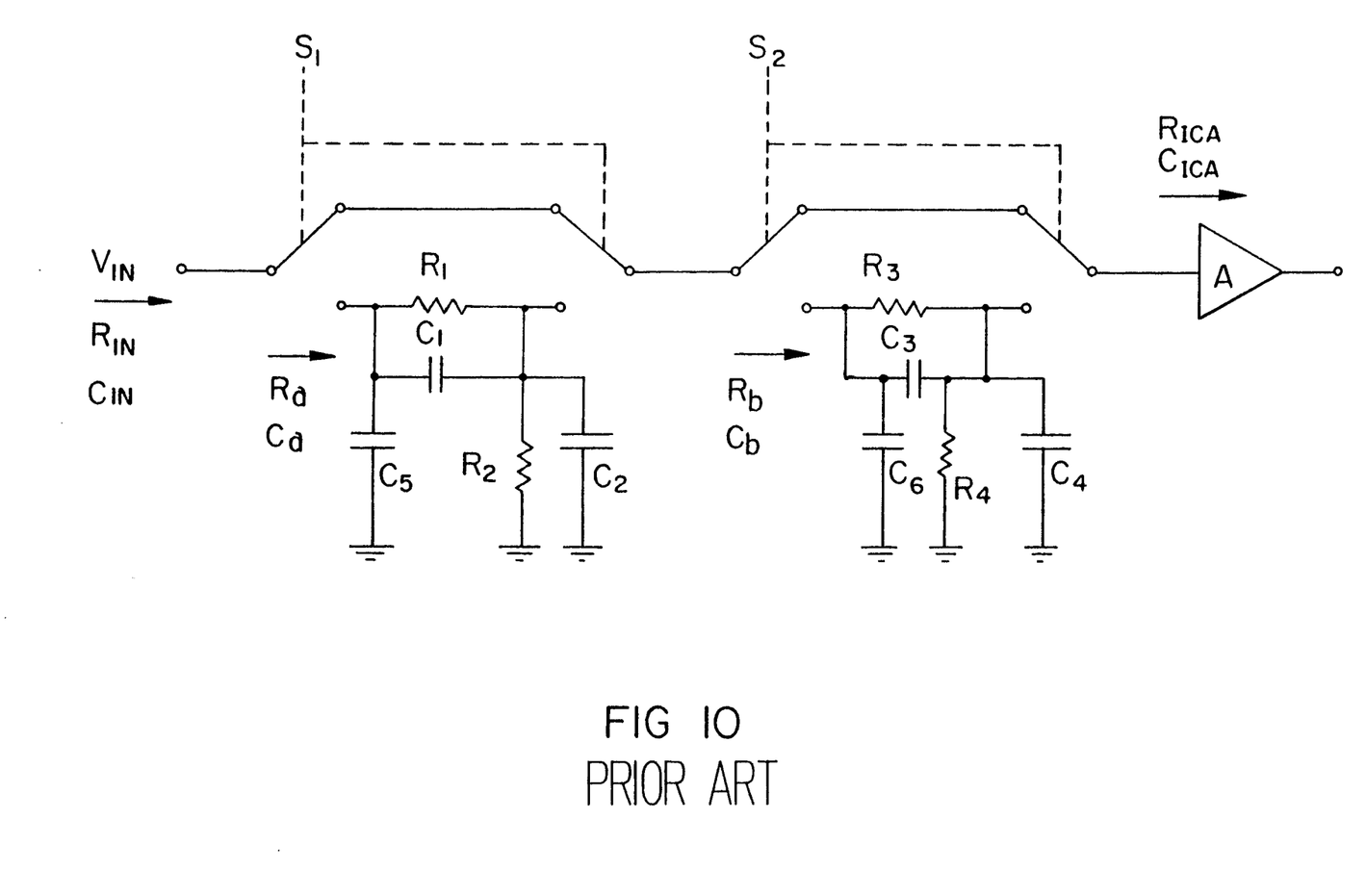
FIG. 10 illustrates a typical prior art tuned RC attenuator circuit.

Prior art attenuator circuits typically make use of tuned RC circuits in order to provide a signal attenuation function. The tuned RC circuits used are typically compensated dividers, two of which are illustrated in FIG. 10. Switches S1 and S2 are operable to connect either none, one or both of the compensated dividers in series between the input lead $V_{in}$ and the input impedance conversion amplifier A to thereby divide the input signal by 1, N, M or N*M (assuming that the compensated divider associated with switch S1 is a÷N while that associated with switch S2 id a÷M circuit). Since the compensated dividers are switchably connectable in various combinations, the input impedances of all the circuit segments must be identical. Therefore, $R_{in}=R_a=R_b=R_{ICA}$ and $C_{in}=C_a=C_b=C_{ICA}$. In addition, within each compensated divider, the time constants of each pair of tuned elements must also be identical with $R_1C_1=R_2(C_2+C_{ICA})$ and $R_3C_3 = R_4(C_4 + C_{ICA})$. In order to satisfy all of these conditions, all of the components may have to be adjusted and some of these adjustments are interdependent.

Precision Programmable Attenuator Architecture

Figure 1:
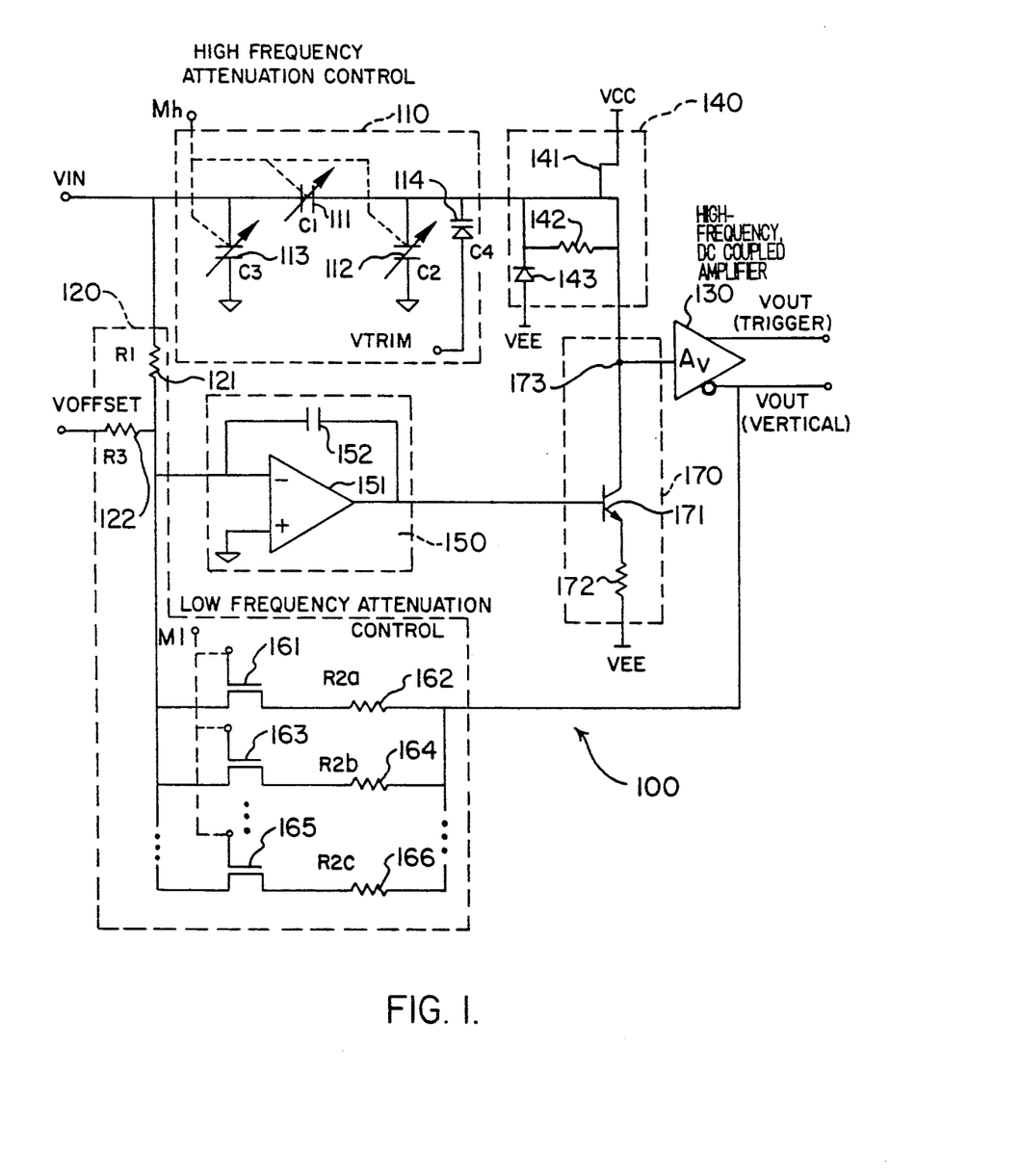
FIG. 1 illustrates in schematic diagram form the attenuator circuit of the present invention.

FIG. 1 illustrates in schematic diagram form the architecture and preferred embodiment of the precision programmable attenuator of the present invention. This circuit receives an input signal $V_{in}$ of variable magnitude and converts this signal to an output signal $V_{out}$ (vertical) which is a replica of the input signal $V_{in}$ and having a magnitude which represents the reduction of the amplitude of the input signal by a predetermined factor. The function of attenuator 100 is to reduce the applied input signal $V_{in}$ by an amount that satisfies this requirement without affecting the frequency response of the signal. Attenuator 100 is comprised of a pair of parallel connected dividers which do not interact with each other. Therefore, each of the dividers can be adjusted separately without affecting the operation of the other divider. Control of the attenuation function is accomplished by control signals applied to control leads $M_h$ and $M_l$ to control the attenuation in the high frequency range and low frequency range, respectively.

These dividers consist of high frequency divider 110 and low frequency divider 120 which are implemented using a capacitive divider and a resistive divider, respectively. The capacitive divider 110 is an AC coupled circuit which functions to pass the high frequency component of the input signal $V_{in}$ and attenuate this signal by an amount determined by the control signals applied to control lead $M_h$. Similarly, the low frequency divider 120 is comprised of a resistive divider where the magnitude of the attenuation is controlled by the control signal applied to lead $M_l$. By use of capacitive and resistive dividers to attenuate the high frequency and low frequency signals, respectively, two parallel connected non-interactive dividers can be used to implement attenuator 100. Thus, the attenuation of each divider can be adjusted separately without affecting the operation of the other parallel connected attenuator.

In practice, a test signal of precisely determined magnitude and frequency spectrum is applied to the attenuator input. The output of attenuator 100 is then measured and compared to a standard output signal response. The high and low frequency attenuator segments are electronically adjusted until the attenuator output matches the standard output reference signal. The attenuator settings are stored in a nonvolatile memory to maintain the attenuator elements at the determined setting.

The output of the low frequency divider 120 is connected through integrator 150 to summing circuit 170 which combines this signal with the output of high impedance buffer 140 which couples the output of the high frequency attenuator 110. The combined signals are output by summing circuit 170 to high frequency DC coupled amplifier 130 which produces the output signal $V_{out}$. The advantages of this design are that the low frequency divider can be made entirely solid state since only passive component R1 is subjected to high voltages. The high frequency divider is purely capacitive and is therefore simpler to implement than previous tuned RC circuits. By avoiding the use of tuned circuits, there are no time constants to be matched and the high frequency and low frequency paths are totally independent to simplify calibration and trimming. In addition, the use of separate resistive and capacitive dividers allows continuously variable attenuation unlike the discrete steps of attenuation provided in previous tuned circuit attenuators. Furthermore, the use of continuously variable elements eliminates the need for switch contacts, which contribute to long term reliability problems. Finally, the high frequency amplifier 130 can be implemented with a fixed gain device instead of the variable gain amplifier of prior attenuator circuits. In practice, amplifier 130 has a flat frequency response comparable to that of the combined high and low frequency attenuators; i.e. from DC to beyond the instrument's bandwidth.

Low Frequency Divider

Low frequency divider 120 is implemented, for example, using a plurality of resistors 121, 122 and a plurality of feedback resistors 162, 164, 166 which are switchably interconnected to the output of high frequency amplifier 130 by the respective switches 161, 163, 165. The low frequency attenuation control signal on lead $M_l$ selectively activates these electronic switches 161, 163, 165 to control the selection of the feedback resistor placed between the output of high frequency amplifier 130 and the junction of resistors 121, 122. A voltage offset adjustment terminal $V_{offset}$ is provided to vary the voltage offset of resistive divider 120. The output of the resistive divider is obtained from the junction of resistors 121 and 122 and applied to integrator 150 which is comprised of an amplifier 151 with a feedback capacitor 152 of conventional design.

The resistive divider can be implemented in a number of ways. In place of the plurality of resistors 162, 164, 166 and their associated electronic switches 161, 163, 165, a digital to analog converter can be used as a signal multiplier or a continuously variable resistance such as the channel of an FET or a photocell/phototransistor can be used. In either implementation, the entirety of low frequency divider 120 can be fabricated in an integrated circuit format without the use of switch contacts. The resultant resistive divider is electronically programmable to continuously or piecewise continuously vary the attenuation ratio of the low frequency divider.

High Frequency Divider

The high frequency divider 110 is implemented using a plurality of capacitors 111-114 interconnected, for example, in a pi configuration. In the embodiment illustrated in FIG. 1, all four of these capacitors are shown as variable, but it is envisioned that one or more of these capacitors may be fixed elements. The control signal applied on lead $M_h$ controls the capacitance setting of capacitors 111-113. By controlling the capacitance of these elements, the attenuation of the high frequency divider 110 is thereby electronically selected to be continuously variable over a wide range of values. Since the high frequency divider 110 is not a tuned circuit, nor is low frequency divider 120, these circuits do not interact and are independently settable to a desired attenuation value. An electronically adjustable varactor diode 114 is also provided at the output of the pi network of capacitors 111-113 to produce a fine tuning of the attenuation of high frequency divider 110, since the remaining capacitors 111-113 are greater in magnitude and provide less precision in setting the attenuation ratio. In addition, the attenuation can be electronically adjusted in a dynamic fashion without the use of user intervention as will be illustrated herein.

Output Driver

The output of high frequency divider 110 is transmitted to high impedance buffer 140 which includes field effect transistor 141, feedback resistor 142 and diode 143. This high impedance amplifier 140 serves to transmit the signal output from high frequency divider 110 to the input of high frequency amplifier 130 without loading the output of divider 110.

Summing circuit 170 is comprised of a transistor 171 and emitter resistor 172 and functions to combine the low frequency attenuated signal output from integrator 150 and applied to the base of transistor 171 with the attenuated high frequency signal applied to the collector of transistor 171 by high frequency amplifier 140. These combined signals are input on lead 173 to high frequency amplifier 130 which outputs the composite signal on output lead $V_{out}$ (vertical). The field effect transistor 141 functions as an impedance converter to convert the high impedance at high frequencies presented by high frequency divider 110 to a low output impedance presented to high frequency amplifier 130. The field effect transistor 141 is self biased to achieve the highest possible input impedance.

Variable Capacitors

In order to make the high frequency divider continuously variable and electronically controllable, the capacitive voltage divider illustrated in FIGS. 2-7 can be used in attenuator 100. This configuration consists of an electrically controllable, mechanically variable set of capacitors used to realize the high frequency divider 110. Since the capacitance is a function of the dielectric constant of the material separating the plates as well as the distance between the plates and the area of the capacitor, varying any one or more of these parameters can vary the capacitance produced the capacitor. A simple variable capacitor configuration can be constructed by simply varying the plate area of the capacitor.

Figures 2, 3:
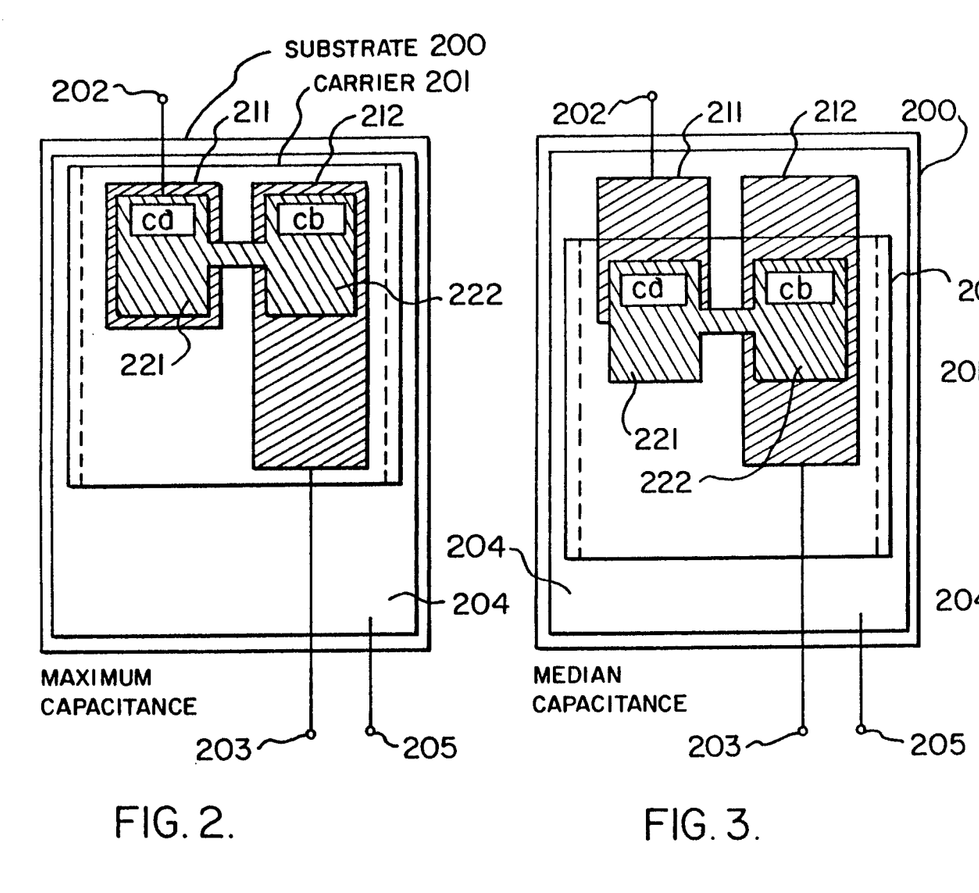
FIGS. 2–4 illustrate the structure of the variable capacitor.
Figure 4:
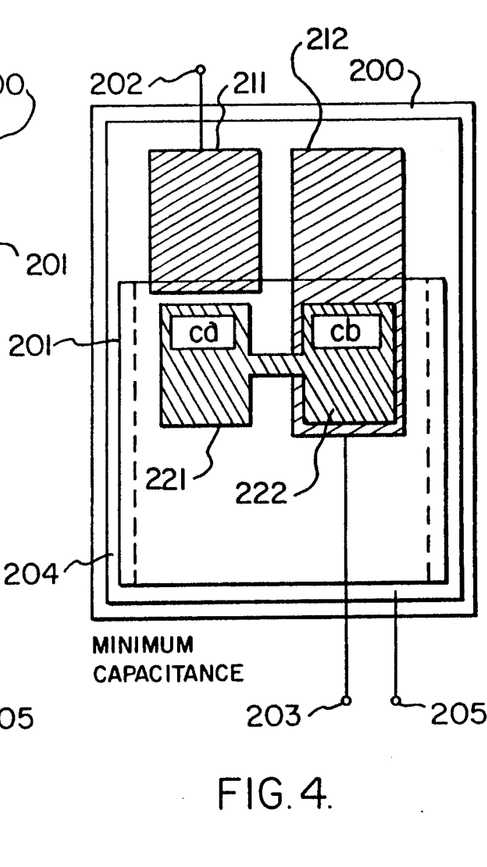

The variable capacitor implementation illustrated in FIGS. 2-7 places one plate 211, 212 of the capacitor on a flat base, which is substrate 200, with the other plate 221, 222 of the capacitor being on a sliding member 201 also called the carrier. As the carrier 201 is moved relative to substrate 200, the overlapping areas of the two plates of the capacitor vary, thereby changing the effective plate area and therefore the capacitance. The capacitor illustrated in FIGS. 2-4 represents a variable capacitor that is suitable for construction without sliding electrical contacts. Both terminals of the capacitors 202, 203 lie on the substrate 200. Capacitor Cb is a fixed capacitor while capacitor Ca is a variable capacitor. Substrate 200 and carrier 201 are made of a dielectric material such as ceramic or plastic. Conductive plates are deposited on the mating surfaces of substrate 200 and carrier 201 using thin metallic films. The space between the metallic plates is filled with a dielectric material 204 having a high dielectric strength.

In FIG. 2, capacitor Ca is shown at maximum capacitance and the plates 212, 222 of capacitor Cb are designed such that the capacitance remains constant as the carrier is moved from the position illustrated in FIG. 2 to the position illustrated in FIG. 4. FIG. 3 illustrates carrier 201 positioned for median capacitance while a minimum capacitance is shown by the position of carrier 201 in FIG. 4.

Figure 8:
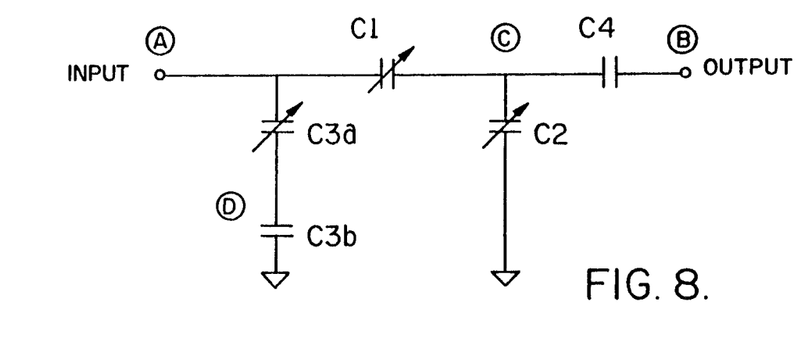
FIG. 8 illustrates a schematic diagram of a capacitive voltage divider using both fixed and variable capacitors.
Figure 9:
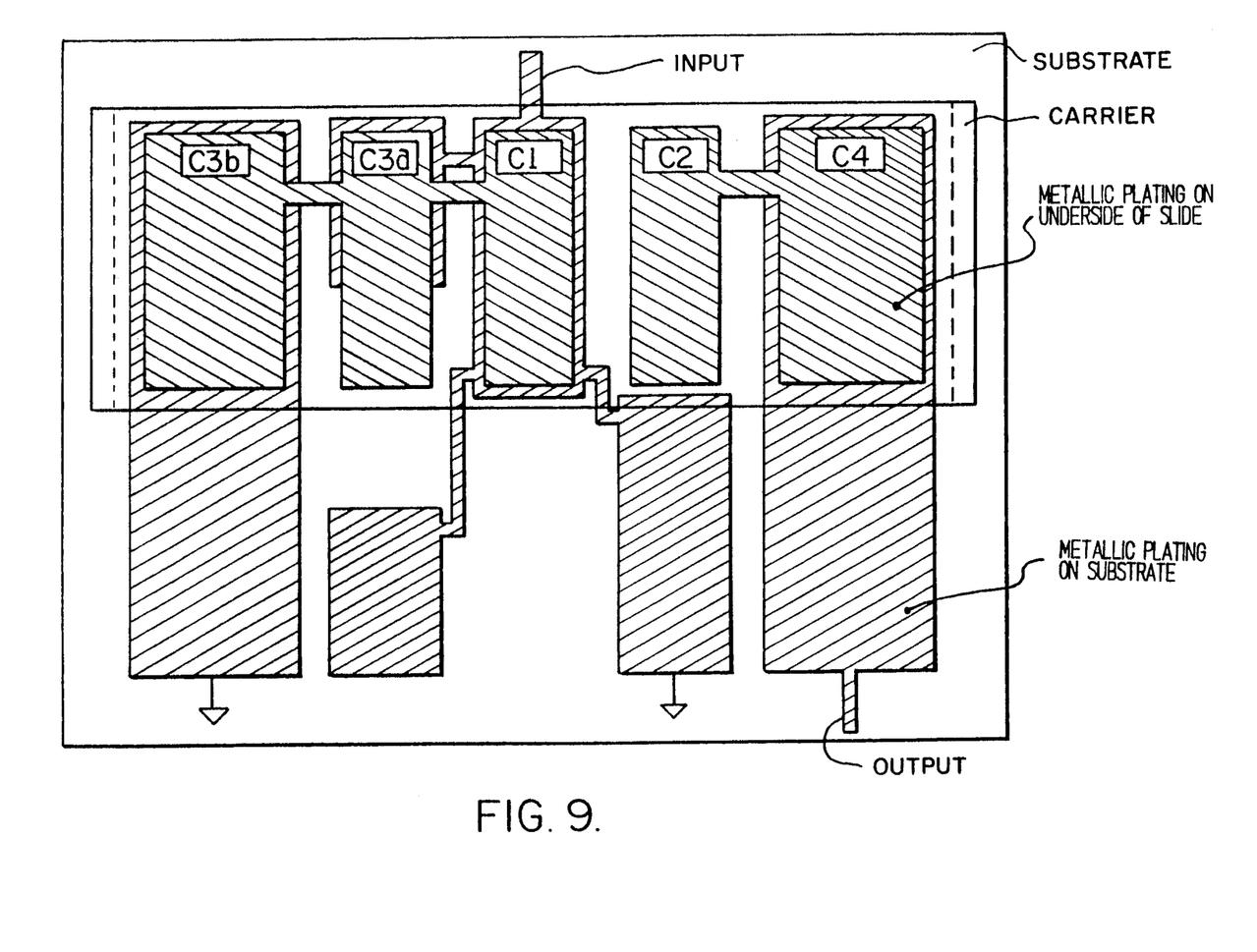
FIG. 9 illustrates the physical construction of the capacitive voltage divider of FIG. 8.

FIG. 8 illustrates in schematic diagram form an implementation of the capacitive voltage divider 110 of FIG. 1, wherein a combination of fixed and variable capacitors are used. FIG. 9 illustrates the physical construction of the capacitor voltage divider illustrated in FIG. 8. The carrier 201 is illustrated as spanning all of the capacitors on substrate 200. The configuration illustrated in FIG. 9 shows capacitance C1 at a maximum value while capacitor C2 is at a minimum value thereby giving minimum attenuation on maximum gain to the capacitive divider 110. At the other extreme where carrier 201 is located at the bottom of substrate 200, maximum attenuation is provided by providing a maximum value for capacitor C2 and a minimum value for capacitor C1. Capacitors C3b and C4 remain constant in area and therefore constant in capacitance. Capacitor C3a compensates for variations in the effective input capacitance of the divider and therefore its capacitance must be maximum value at the extremes of attenuation and low for mid-range attenuation ratios. Therefore, the physical configuration shown in FIG. 9 provides maximum capacitance for capacitor C3a at the extreme limits of the movement of carrier 201.

The capacitive dividers illustrated in FIGS. 2-4 and 8 demonstrate implementations wherein some of the capacitors are variable and some are fixed in value. The variable capacitors are illustrated as being "ganged" together and tuned using a single control signal. It is obvious that each of the variable capacitors 111-113 in capacitive divider 110 can be independently controlled, rather than tied to the other variable capacitors. The variation of plate overlap in this implementation illustrates only one method of controlling the capacitance in capacitive divider 110. An alternative method of varying the capacitance is the use of electrically alterable dielectrics 204. These dielectrics vary in dielectric constant as a function of the voltage applied thereto via lead 205. Thus, the capacitive divider can use one or both of these capacitance control mechanisms to provide continuous variability of capacitance over a wide range of values. Also, capacitor plate separation can be varied, and graded or otherwise varying dielectrics can be used.

Mechanical Construction of Capacitive Voltage Divider

Figure 5:
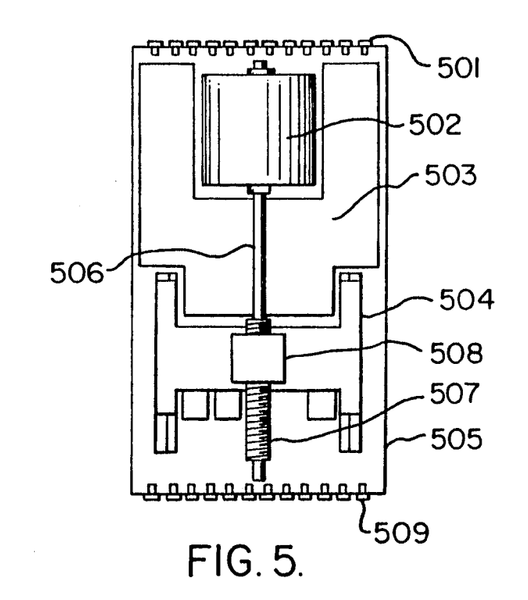
FIGS. 5–7 illustrate prospective views of the mechanical apparatus that operates the variable capacitor.
Figure 6:
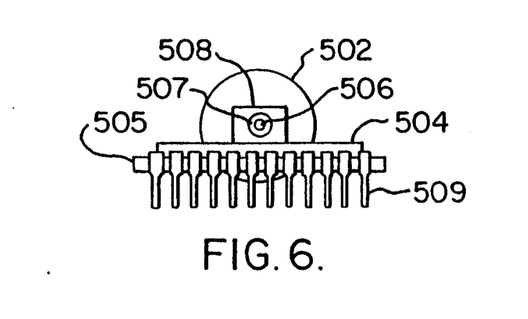
Figure 7:
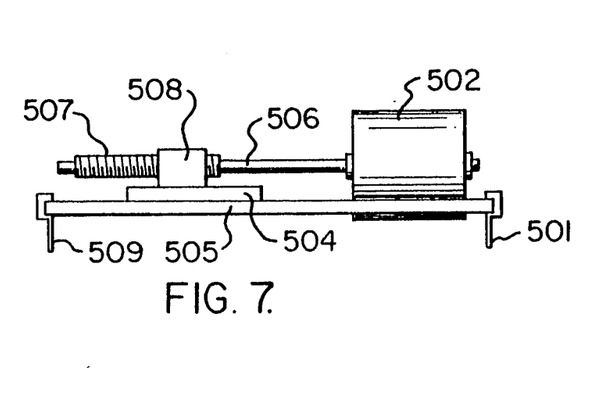

FIGS. 5-7 illustrate top, end and side perspective views of the capacitive voltage divider 110. Substrate 505 and carrier 504 correspond to substrate 202 and carrier 201 of the previous figures. Conductors 501 and 509 represent pins for electrical connection of this divider to an associated printed circuit board. A stepping motor 502 is provided connected by shaft 506 to a lead screw 507. The rotation of shaft 506 causes lead screw 507 to rotate in leader block 508 thereby moving carrier 504 linearly in a direction along the length of screw 507 to position carrier 504 over the capacitor plates 212, 211 as shown in the previous figures. The operation of stepping motor 502 can be controlled electrically (via lead $M_h$) by an appropriate drive circuit 503 with feedback to controllably position carrier 504 in the appropriate location over substrate 505 to obtain the proper capacitance for the variable capacitors in capacitive voltage divider 110.

Summary

The precision programmable attenuator makes use of a pair of parallel connected non-interactive divider circuits to provide constant attenuation over a wide range of frequencies. By separating the attenuator into low and high frequency sections, implemented by using purely resistive and capacitive dividers, respectively, interaction between the two sections is eliminated. The divider sections are also electrically programmable using a simple process to obtain precise attenuation ratios.

Also, by proper arrangement of fixed and variable capacitors, the high frequency capacitive divider can be implemented with no mechanical switches.

While a specific embodiment of this invention has been disclosed, it is expected that those skilled in the art can and will design alternate embodiments of this invention that fall within the scope of the appended claims.

I claim:

1. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:

resistive divider means, connected between said input and output terminals and having an attenuation ratio indicative of the magnitude of said reduction of the amplitude of said applied signals, for attenuating low frequency components of said applied signals uniformly over a predetermined range of frequencies;

capacitive divider means, connected between said input and output terminals and having an attenuation ratio indicative of the magnitude of said reduction of the amplitude of said applied signals, for attenuating high frequency components of said applied signals uniformly over a predetermined range of frequencies, including at least one variable capacitance having:

substrate means having a conductor deposited on a flat surface thereof to implement one plate of said variable capacitance;

dielectric means deposited on said conductor;

carrier means having a conductor deposited on a flat surface thereof, wherein said carrier surface is coplanar with said substrate flat surface and said carrier flat surface is juxtaposed to said dielectric means;

means for slidably moving said carrier means across said dielectric means to vary the amount of said substrate conductor overlaid by said carrier means conductor, thereby varying the capacitance of said variable capacitance.

2. The apparatus of claim 1 further comprising:
means for controllably adjusting said attenuation ratio of said capacitive divider means to match said attenuation ratio of said resistive divider means.

3. The apparatus of claim 2 wherein said capacitive divider means further includes:
means for mechanically varying said slidably moving means;
means for producing a drive signal to operate said mechanically varying means.

4. The apparatus of claim 1 further comprising:
means for controllably adjusting said attenuation ratio of said resistive divider means to match said attenuation ratio of said capacitive divider means.

5. The apparatus of claim 1 further including:
means connected to said resistive divider means and said capacitive divider means for combining said attenuated low frequency components and said attenuated high frequency components received from said resistive divider means and said capacitive divider means, respectively;
means connected to and interconnecting said combining means and said output terminals for applying said combined attenuated low and high frequency components to said output terminals.

6. The apparatus of claim 5 further comprising:
feedback means for producing a feedback signal proportional to said reduced amplitude signal appearing on said output terminals;
means for combining a selected ratio of said feedback signal with said attenuated low frequency signal.

7. The apparatus of claim 6 further including:
a plurality of means for reducing the magnitude of said feedback signal by a predetermined amount, each said reducing means operating to reduce the magnitude of said feedback signal by a different predetermined amount than the other reducing means,
means for activating at least one of said reducing means to apply said reduced magnitude feedback signal to said attenuated low frequency signal.

8. The apparatus of claim 1 wherein said capacitive divider means includes an electrically adjustable capacitor.

9. The apparatus of claim 1 wherein said capacitive divider means include at least three capacitors connected into a pi network having first and second ends.

10. The apparatus of claim 9 wherein said first end of said pi network is connected to said input terminals and said second end of said pi network is connected to said output terminals, said plurality of capacitors further including:
varactor diode means connected between said second end of said pi network and a control signal lead for providing an electrically adjustable fine tuning of said attenuation ratio of said capacitive divider means.

11. The apparatus of claim 9 wherein all three capacitors in said pi network are variable.

12. The apparatus of claim 1 wherein said slidably moving means includes:
motor means, responsive to a control signal applied thereto for translating said control signal into a mechanical movement;
arm means having a first end connected to said carrier means and a second end connected to said motor means for transmitting said mechanical movement produced by said motor means to said carrier means to vary the amount of said substrate conductor overlaid by said carrier means conductor, thereby varying the capacitance of said variable capacitance.

13. The apparatus of claim 12, wherein said mechanical movement comprises the rotation of a shaft integral to said motor means, said arm means comprises:
shaft means having a first end connected to said motor shaft to transmit said motor shaft rotation to said shaft means and having a threaded second end,
leader block means connected to said carrier means and having a threaded hole therein which receives said second end of said shaft means for translating said rotation of said shaft means into linear displacement motion of said carrier means across said dielectric means.

14. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:

resistive divider means, connected between said input and output terminals and having an attenuation ratio indicative of the magnitude of said reduction of the amplitude of said applied signals, for attenuating low frequency components of said applied signals uniformly over a predetermined range of frequencies;

capacitive divider means, connected between said input and output terminals and having an attenuation ratio indicative of the magnitude of said reduction of the amplitude of said applied signals, for attenuating high frequency components of said applied signals uniformly over a predetermined range of frequencies without interacting with said resistive divider means; wherein said resistive divider means includes:

means for producing an offset signal to vary the DC level of the signal appearing at said output terminals relative to the DC level of the signal applied to said input terminal.

15. The apparatus of claim 14 wherein said capacitive divider means comprises:

a plurality of capacitors, at least one of which is of variable capacitance.

16. The apparatus of claim 15 wherein said variable capacitance comprises:

substrate means having a conductor deposited on a flat surface thereof to implement one plate of said variable capacitance;

dielectric means deposited on said conductor;

carrier means having a conductor deposited on a flat surface thereof, wherein said carrier surface is coplanar with said substrate flat surface and said carrier flat surface is juxtaposed to said dielectric means;

means for slidably moving said carrier means across said dielectric means to vary the amount of said substrate conductor overlaid by said carrier means conductor, thereby varying the capacitance of said variable capacitance.

17. The apparatus of claim 14 further comprising:

means for controllably adjusting said attenuation ratio of said second divider means to match said attenuation ratio of said first divider means.

18. The apparatus of claim 14 further comprising:

means for controllably adjusting said attenuation ratio of said first divider means to match said attenuation ratio of said second divider means.

19. The apparatus of claim 14 further including:

means connected to said first divider means and said second divider means for combining said attenuated low frequency components and said attenuated high frequency components received from said first divider means and said second divider means, respectively;

means connected to and interconnecting said combining means and said output terminals for applying said combined attenuated low and high frequency components to said output terminals.

20. The apparatus of claim 19 further comprising:

feedback means for producing a feedback signal proportional to said reduced amplitude signals appearing on said output terminals;

means for combining a selected ratio of said feedback signal with said attenuated low frequency signal.

21. The apparatus of claim 20 further including;

a plurality of means for reducing the magnitude of said feedback signal by a predetermined amount, each said reducing means operating to reduce the magnitude of said feedback signal by a different predetermined amount than the other reducing means, means for activating at least one of said reducing means to apply said reduced magnitude feedback signal to said attenuated low frequency signal.

22. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:

resistive divider means, connected between said input and output terminals and having an attenuation ratio indicative of the magnitude of said reduction of the amplitude of said applied signals, for attenuating low frequency components of said applied signals uniformly over a predetermined range of frequencies;

capacitive divider means, connected between said input and output terminals and having an attenuation ratio indicative of the magnitude of said reduction of the amplitude of said applied signals, for attenuating high frequency components of said applied signals uniformly over a predetermined range of frequencies, including at least one variable capacitance having:

substrate means having a conductor deposited on a flat surface thereof to implement one plate of said variable capacitance;

electrically alterable dielectric means deposited on said conductor;

carrier means having a conductor deposited on a flat surface thereof, wherein said carrier surface is coplanar with said substrate flat surface and said carrier flat surface is juxtaposed to said dielectric means;

means for applying an electrical signal to said dielectric means to vary the dielectric constant thereof, thereby varying the capacitance of said variable capacitance.

23. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:

DC coupled divider means, connected between said input and output terminals and having an attenuation ratio indicative of the magnitude of said reduction of the amplitude of said applied signals, for attenuating low frequency components of said applied signals uniformly over a predetermined range of frequencies;

AC coupled divider means, connected between said input and output terminals and having an attenuation ratio indicative of the magnitude of said reduction of the amplitude of said applied signals, for attenuating high frequency components of said applied signals uniformly over a predetermined range of frequencies, including at least one variable capacitor having:

substrate means having a conductor deposited on a flat surface thereof to implement one plate of said variable capacitor;

dielectric means deposited on said conductor;

carrier means having a conductor deposited on a flat surface thereof, wherein said carrier surface is coplanar with said substrate flat surface and said carrier flat surface is juxtaposed to said dielectric means;

means for slidably moving said carrier means across said dielectric means to vary the amount of said substrate conductor overlaid by said carrier means conductor, thereby varying the capacitance of said variable capacitor.

24. The apparatus of claim 23 further comprising:
means for controllably adjusting said attenuation ratio of said AC coupled divider means to match said attenuation ratio of said DC coupled divider means.

25. The apparatus of claim 24 wherein said AC coupled divider means further includes:
means for mechanically varying said slidably moving means;
means for producing a drive signal to operate said mechanically varying means.

26. The apparatus of claim 23 further comprising:
means for controllably adjusting said attenuation ratio of said DC coupled divider means to match said attenuation ratio of said AC coupled divider means.

27. The apparatus of claim 23 further including:
means connected to said DC coupled divider means and said AC coupled divider means for combining said attenuated low frequency components and said attenuated high frequency components received from said DC coupled divider means and said AC coupled divider means, respectively;
means connected to and interconnecting said combining means and said output terminals for applying said combined attenuated low and high frequency components to said output terminals.

28. The apparatus of claim 27 further comprising:
feedback means for producing a feedback signal proportional to said reduced amplitude signal appearing on said output terminals;
means for combining a selected ratio of said feedback signal with said attenuated low frequency signal.

29. The apparatus of claim 28 further comprising:
a plurality of means for reducing the magnitude of said feedback signal by a predetermined amount, each said reducing means operating to reduce the magnitude of said feedback signal by a different predetermined amount than the other reducing means,
means for activating at least one of said reducing means to apply said reduced magnitude feedback signal to said attenuated low frequency signal.

30. The apparatus of claim 27 wherein said DC coupled divider means comprises:
resistive divider means connected to and interconnecting said input terminals and said combining means.

31. The apparatus of claim 27 wherein said AC coupled divider means comprises:

capacitive divider means connected to and interconnecting said input terminals and said combining means.

32. The apparatus of claim 23 wherein said AC coupled divider means comprises:
a plurality of capacitors, at least one of which is of variable capacitance.

33. The apparatus of claim 23 wherein said AC coupled divider means include at least three capacitors connected into a pi network having first and second ends.

34. The apparatus of claim 33 wherein said first end of said pi network is connected to said input terminals and said second end of said pi network is connected to said output terminals, said plurality of capacitors further including:
varactor diode means connected between said second end of said pi network and a control signal lead for providing an electrically adjustable fine tuning of said attenuation ratio of said capacitive divider means.

35. The apparatus of claim 33 wherein all three capacitors in said pi network are variable.

36. The apparatus of claim 23 wherein said slidably moving means includes:
motor means, responsive to a control signal applied thereto for translating said control signal into a mechanical movement;
arm means having a first end connected to said carrier means and a second end connected to said motor means for transmitting said mechanical movement produced by said motor means to said carrier means to vary the amount of said substrate conductor overlaid by said carrier means conductor, thereby varying the capacitance of said variable capacitance.

37. The apparatus of claim 36, wherein said mechanical movement comprises the rotation of a shaft integral to said motor means, said arm means comprises:
shaft means having a first end connected to said motor shaft to transmit said motor shaft rotation to said shaft means and having a threaded second end,
leader block means connected to said carrier means and having a threaded hole therein which receives said second end of said shaft means for translating said rotation of said shaft means into linear displacement motion of said carrier means across said dielectric means.

38. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:
DC coupled divider means, connected between said input and output terminals and having an attenuation ratio indicative of the magnitude of said reduction of the amplitude of said applied signals, for attenuating low frequency components of said applied signals uniformly over a predetermined range of frequencies;
AC coupled divider means, connected between said input and output terminals and having an attenuation ratio indicative of the magnitude of said reduction of the amplitude of said applied signals, for attenuating high frequency components of said applied signals uniformly over a predetermined range of frequencies, including at least one variable capacitance having:

substrate means having a conductor deposited on a flat surface thereof to implement one plate of said variable capacitance;

electrically alterable dielectric means deposited on said conductor;

carrier means having a conductor deposited on a flat surface thereof, wherein said carrier surface is coplanar with said substrate flat surface and said carrier flat surface is juxtaposed to said dielectric means;

means for applying an electrical signal to said dielectric means to vary the dielectric constant thereof, thereby varying the capacitance of said variable capacitance.

39. An attenuator circuit having input and output terminals for reducing, uniformly over a predetermined range of frequencies, the amplitude of signals applied to said input terminals to a magnitude that is less than a predetermined amount and applying said reduced amplitude signals to said output terminals, comprising:

resistive divider means, connected between said input and output terminals and having an attenuation ratio indicative of the magnitude of said reduction of the amplitude of said applied signals, for attenuating low frequency components of said applied signals uniformly over a predetermined range of frequencies;

capacitive divider means, connected between said input and output terminals and having an attenuation ratio indicative of the magnitude of said reduction of the amplitude of said applied signals, for attenuating high frequency components of said applied signals uniformly over a predetermined range of frequencies without interacting with said resistive divider means, including at least one variable capacitor having:

substrate means having a conductor deposited on a flat surface thereof to implement one plate of said variable capacitor;

dielectric means deposited on said conductor;

carrier means having a conductor deposited on a flat surface thereof, wherein said carrier surface is coplanar with said substrate flat surface and said carrier flat surface is juxtaposed to said dielectric means;

means for slidably moving said carrier means across said dielectric means to vary the amount of said substrate conductor overlaid by said carrier means conductor, thereby varying the capacitance of said variable capacitor;

means for controllably adjusting said attenuation ratio of said capacitive divider means to match said attenuation ratio of said resistive divider means;

means connected to said resistive divider means and said capacitive divider means for combining said attenuated low frequency components and said attenuated high frequency components received from said resistive divider means and said capacitive divider means, respectively;

means connected to and interconnecting said combining means and said output terminals for applying said combined attenuated low and high frequency components to said output terminals;

feedback means for producing a feedback signal proportional to said reduced amplitude signal appearing on said output terminals, including:

a plurality of means for reducing the magnitude of said feedback signal by a predetermined amount, each said reducing means operating to reduce the magnitude of said feedback signal by a different predetermined amount than the other reducing means, means for activating at least one of said reducing means to apply said reduced magnitude feedback signal to said attenuated low frequency signal.

* * * * *